(12) United States Patent
Tan et al.

(10) Patent No.: US 9,685,314 B2
(45) Date of Patent: Jun. 20, 2017

(54) POSITIONING DEVICE FOR HORIZONTAL EXTERNAL IGNITION APPARATUS

(71) Applicants: Ruilei Tan, Beijing (CN); Jinwei Dong, Beijing (CN)

(72) Inventors: Ruilei Tan, Beijing (CN); Jinwei Dong, Beijing (CN)

(73) Assignee: NAURA TECHNOLOGY GROUP CO., LTD., Beijing (CN)

( * ) Notice: Subject to any disclaimer, the term of this patent is extended or adjusted under 35 U.S.C. 154(b) by 275 days.

(21) Appl. No.: 14/520,337

(22) Filed: Oct. 21, 2014

(65) Prior Publication Data

US 2015/0308688 A1    Oct. 29, 2015

(30) Foreign Application Priority Data

Apr. 28, 2014   (CN) .......................... 2014 1 0174582

(51) Int. Cl.
*F23Q 13/00*    (2006.01)
*H01L 21/00*    (2006.01)
*H01L 21/67*    (2006.01)

(52) U.S. Cl.
CPC ........ *H01L 21/00* (2013.01); *H01L 21/67017* (2013.01); *H01L 21/67109* (2013.01)

(58) Field of Classification Search
CPC ........................................................ H01L 1/00
USPC .................................................. 431/253, 266
See application file for complete search history.

(56) References Cited

U.S. PATENT DOCUMENTS

| 2,902,553 | A | * | 9/1959 | Bensinger | ................. F02P 5/02 |
| | | | | | 123/146.5 R |
| 4,470,799 | A | * | 9/1984 | Riggs | ..................... C01B 21/28 |
| | | | | | 279/99 |

* cited by examiner

*Primary Examiner* — Avinash Savani
(74) *Attorney, Agent, or Firm* — Tianchen LLC

(57) ABSTRACT

The invention discloses a positioning device for a horizontal external ignition apparatus. The positioning device comprises a rotating module, an expansion module, a lifting module, and a mounting member fixed at the bottom of a water cooling device of the ignition apparatus. The rotating module drives the mounting member and the external ignition chamber of the ignition apparatus to rotate around the spindle member of the rotating module and adjust the rotation angle. The expansion module adjust the lateral movement of the mounting member and the external ignition chamber along the expansion member of the expansion module. The lifting module adjust the longitudinal movement of the mounting member and the external ignition chamber.

11 Claims, 4 Drawing Sheets

POSITIONING DEVICE FOR HORIZONTAL EXTERNAL IGNITION APPARATUS

CROSS-REFERENCES TO RELATED APPLICATIONS

This application claims the priority of Chinese patent application number 201410174582.5, filed on Apr. 28, 2014, the entire contents of which are incorporated herein by reference.

FIELD OF THE INVENTION

The present invention relates to the field of semiconductor manufacturing device, and more particularly to a positioning device for a horizontal external ignition apparatus of a heat treatment apparatus.

BACKGROUND OF THE INVENTION

In a vertical semiconductor heat treatment apparatus, an external ignition apparatus is connected to the process chamber of the heat treatment apparatus. The external ignition apparatus comprises an ignition chamber connected to the process chamber through a transition tube, a heating device to heat the process gas and perform a certain reaction, and a gas intake tube to introduce the heated process gas into the process chamber.

FIG. 1 is a view illustrating the connection between a vertical process chamber and a conventional horizontal external ignition apparatus. Referring to FIG. 1, the main process chamber 21 is connected to the external ignition apparatus 22 through respective quartz flanges thereof which form a connecting part 25. An external ignition chamber 26 is arranged in the external ignition apparatus 22 and is fixed in a cylindrical heating device 23. The heating device 23 is fixed in a cylindrical water cooling apparatus 24.

During the operation of the heat treatment apparatus, the sealing between the main process chamber 21 and the external ignition chamber 26 should be ensured, and thus a sealing ring is required to be arranged between the quartz flanges of the main process chamber 21 and the external ignition chamber 26 to perform sealing, and the quartz flanges of the main process chamber 21 and the external ignition chamber 26 should be ensured to have high positioning accuracy and good sealing performance Furthermore, the external chamber 26 is required to be installed and sealed accurately and smoothly. However, since the fragile quartz material cannot bear large deformation, a positioning device is needed to move the external ignition chamber 26, so as to achieve high positioning accuracy and ensure smooth installation and sealing.

According to the different configurations of the external ignition apparatus, the positioning devices can be different. Presently, the positioning device of the horizontal external ignition apparatus utilizes a driving block and a mated driving shaft to perform the moving adjustment and positioning of the ignition apparatus in three dimensions of the space. However, the conventional positioning device is complex in structure and inconvenient in installation, assembly and disassembly.

SUMMARY OF THE INVENTION

Accordingly, at least one object of the present invention is to provide a positioning device for a horizontal external ignition apparatus to accurately position the horizontal external ignition apparatus. The external ignition apparatus includes an external ignition chamber for igniting a process gas to be supplied to a process chamber and a water cooling device fixed surrounding the external ignition chamber. The positioning device is installed at the bottom of the water cooling device for driving the displacement of the external ignition chamber to make a connecting portion of the external ignition chamber align with a connecting portion of the process chamber; wherein the positioning device comprises a mounting member fixed at the bottom of the water cooling device and an adjusting component connected with the mounting member to move the mounting member. The adjusting component comprises a lifting module, an expansion module, and a rotating module. The lifting module has at least one lifting base connected to the mounting member through at least one guiding shaft and a lifting driving member. The lifting driving member moves the mounting member longitudinally along the direction of the guiding shaft relative to the lifting base; the expansion module has a stretchable expansion member fixed on the lifting base to move the lifting base and the mounting member laterally along the expansion direction of the expansion member; the rotating module includes a spindle sleeve and a spindle member rotatablely installed in the spindle sleeve; the spindle member is fixed to the expansion member to drive the expansion member, the lifting base and the mounting member to rotate horizontally around the spindle member.

In one embodiment, a plurality of the guiding shafts are provided and arranged in parallel to each other. The guiding shafts are fixed to the lifting base and penetrates the mounting member, or fixed to the mounting member and penetrates the lifting base to move the mounting member up and down relative to the lifting base along the direction of the guiding shafts, so as to drive the longitudinal displacement of the external ignition chamber; the lifting driving member of the lifting module has an adjusting stud fixed to the lifting base and abutted against the mounting member or the water cooling device, or fixed to the mounting member and abutted against the lifting base or the bottom of the external ignition apparatus; an adjusting nut is provided at the abutment position of the adjusting nut, so as to adjust the distance between the mounting member and the lifting base by screwing the adjusting nut.

In one embodiment, the lifting module has two lifting bases fixedly connected to the two ends of the expansion member respectively; each lifting member has two of the guiding shafts, straight sleeves are provided at the lifting bases or the mounting member for the guiding shafts inserting into or penetrating.

In one embodiment, the lifting module includes a height limit member; the height limit member includes a long slot block having a longitudinal long slot and a round hole block having a round hole provided respectively on the mounting member and the lifting base. An inserting member moves up and down in the longitudinal long slot by penetrating the longitudinal long slot and inserting into the round hole, so as to limit the adjustable range of the distance between the mounting member and the lifting base to the length of the longitudinal long slot.

In one embodiment, the expansion member includes an elongated rod, and a hollow rod which is sleeved around the elongated rod and is movable along the elongated rod; the elongated rod is fixed to the spindle member, and the hollow rod is fixed to the lifting base.

In one embodiment, each of the elongated rod and the hollow rod has a circular cross section, which enables the elongated rod and/or the hollow rod to rotate around the axis thereof and drives the external ignition chamber to rotate around the elongated rod or the hollow rod.

In one embodiment, the expansion module further includes an expansion positioning member; the hollow rod is provided with an aperture for the expansion positioning member inserting into and compressing the elongated rod in the hollow rod, so as to fix the relative position of the hollow rod and the elongated rod.

In one embodiment, the expansion module also includes an expansion limit member; the elongated rod is provided with a lateral long slot and the hollow rod is provided with a circular hole for the expansion limit member penetrating through, so as to limit the adjustable expansion range of the hollow rod along the elongated rod to the length of the lateral long slot.

In one embodiment, the lateral long slot penetrates the front and back sides of the elongated rod, the circular hole penetrates the front and back sides of the hollow rod and forms a thread hole at the back side of the hollow rod, the expansion limit member is a limiting screw rod which inserts into the circular hole at the front side of the hollow rod and the lateral long slot at two sides of the elongated rod to be threaded connected to the thread hole.

In one embodiment, the rotating module further includes a rotating limit member; the rotating limit member includes an angle plate with an arc-shaped groove therein fixed to the spindle member; a positioning screw bolt is positioned in the arc-shaped groove to penetrate the arc-shaped groove of the angle plate and be screwed into the bottom of the external ignition apparatus or a fixing plate at the bottom of the external ignition apparatus, so as to limit the adjustable rotating range of the spindle member to the radian of the arc-shaped groove.

In one embodiment, the lifting base is provided with a plurality of rollers therebelow which are abutted against the bottom of the external ignition apparatus.

Accordingly, the positioning device of the horizontal external ignition apparatus of the present invention can adjust the rotating angle, the lateral movement, and the longitudinal movement of the external ignition chamber by the rotating module, the expansion module, and the lifting module to position the external ignition chamber with excellent effect. Furthermore, the positioning device is simple in structure and convenient in installation, and is enabled to adjust the rotating angle to horizontally extract the external ignition chamber in order to satisfy the requirements for the assembly and disassembly of the external ignition chamber.

In order that objects, characteristics, and advantages of the present invention may be more fully understood, the embodiments of the present invention will now be described in detail hereafter with reference to the accompanying drawings.

DETAILED DESCRIPTION OF THE EMBODIMENTS

Figure 1:
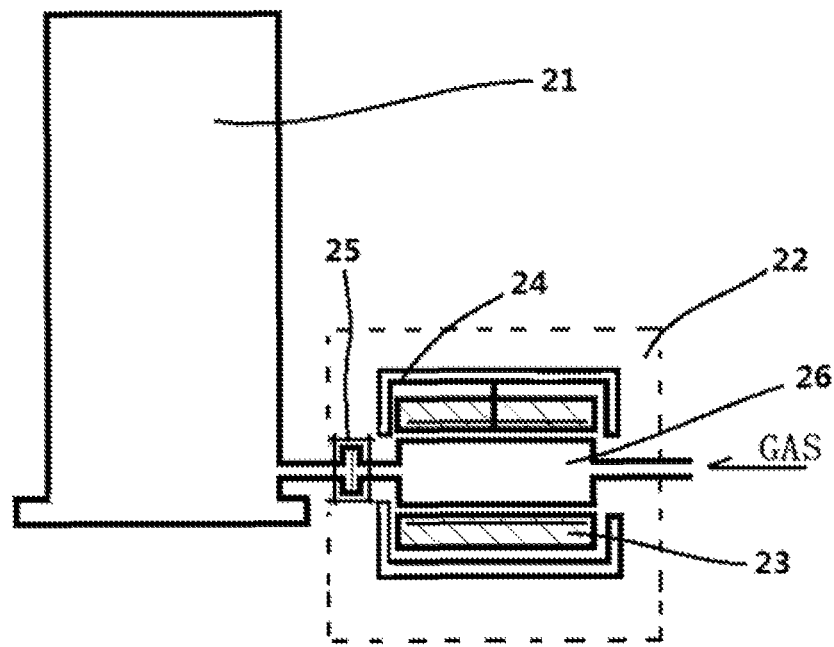
FIG. 1 is a view showing the connection between the vertical process chamber and the conventional horizontal external ignition apparatus.

A positioning device of a horizontal external apparatus according to one preferred embodiment of the present invention will now be described more comprehensively hereinafter with reference to the accompanying drawings, wherein the same element will be described in the same reference numeral.

The present invention provides a positioning device for a horizontal external ignition apparatus. The external ignition is used for igniting a process gas to be supplied to a process chamber, it includes a casing and an external ignition chamber inside the casing. The external ignition chamber is fixed in a cylindrical heating device of the external ignition apparatus, and the heating device is fixed in a cylindrical water cooling device of the external ignition apparatus. The positioning device is installed at the bottom of the water cooling device for driving the displacement of the external ignition chamber to make the connecting portion of the external ignition chamber align with the connecting portion of the process chamber. The positioning device comprises a mounting member fixed at the bottom of the water cooling device and an adjusting component connected with the mounting member to move the mounting member. The adjusting component comprises a lifting module, an expansion module, and a rotating module. The lifting module has at least one lifting base connected to the mounting member through at least one guiding shafts and a lifting driving member. The lifting driving member moves the mounting member longitudinally along the direction of the guiding shaft relative to the lifting base. The expansion module has a stretchable expansion member fixed on the lifting base to move the lifting base and the mounting member laterally along the expansion direction of the expansion member. The rotating module includes a spindle sleeve and a spindle member rotatably installed in the spindle sleeve; the spindle member is fixed to the expansion member to drive the expansion member, the lifting base and the mounting member to rotate horizontally around the spindle member.

First Embodiment

Figure 2:
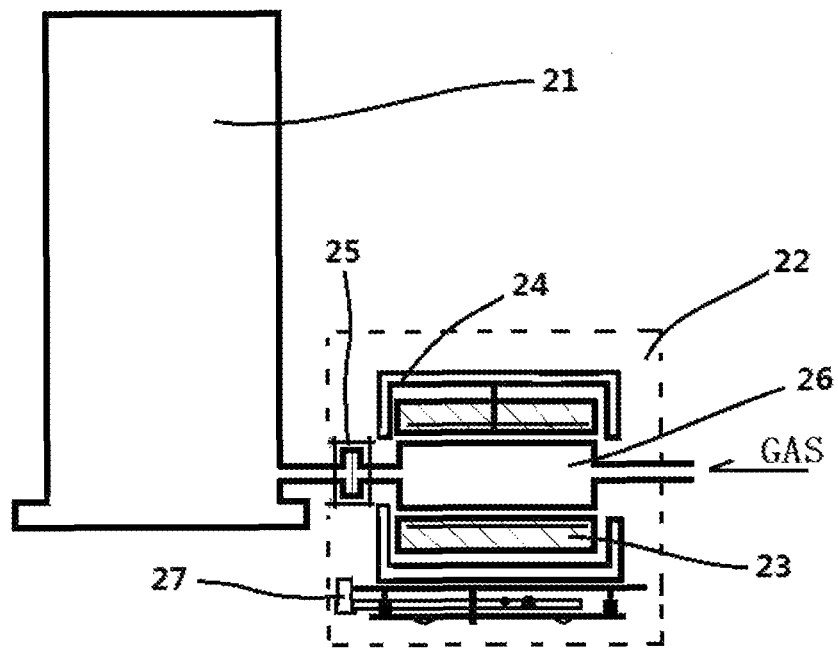
FIG. 2 is a view showing the connection between the positioning device of the present invention and the external ignition apparatus.

Referring to FIG. 2, the positioning device 27 of the present embodiment is installed at the bottom of the water cooling device 24 of the horizontal external ignition apparatus 22.

Figure 3:
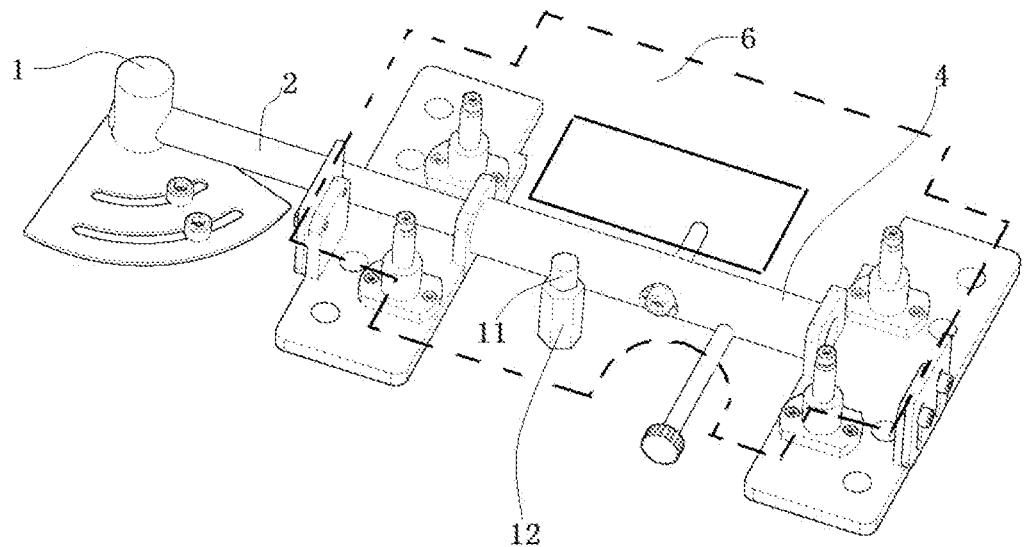
FIG. 3 is a three-dimensional diagram of the positioning device according to the first embodiment of the present invention.
Figure 5:
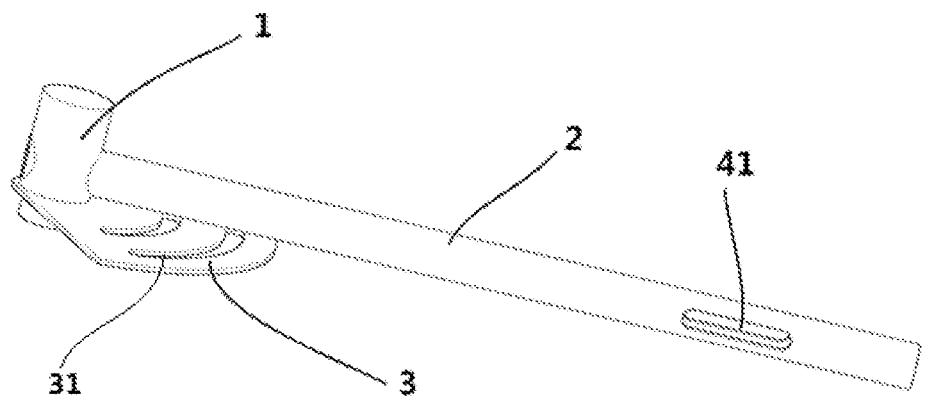
FIG. 5 is a structural view of the spindle member and the elongated rod according to the first embodiment of the present invention.

Referring to FIG. 2, FIG. 3 and FIG. 5, the positioning device 27 of the horizontal external ignition apparatus of the present embodiment includes a mounting plate 6 (the mounting member) and an adjusting component. The mounting plate 6 is fixed to the water cooling device 24 of the external ignition apparatus. A cylindrical heating device 23 is fixed in the cylindrical water cooling device 24 and the external ignition chamber 26 is fixed in the cylindrical heating device 23, therefore the mounting plate 6 is fixed to the external ignition chamber 26.

The adjusting component includes: a rotating module, an expansion module and a lifting module.

The rotating module includes a spindle sleeve 18 and a spindle member 1. The spindle sleeve 18 is fixed at the bottom of the external ignition apparatus 22; and the spindle member 1 is rotatably installed in the spindle sleeve 18 by inserting into the spindle sleeve 18.

The expansion module includes a stretchable expansion member fixed to the spindle member 1. Specifically, the expansion member includes an elongated rod 2 and a hollow rod 4; the elongated rod 2 is mounted on the spindle member 1 and can rotate around the spindle member 1. The hollow rod 4 is sleeved around the elongated rod 2. The hollow rod 4 can move horizontally in the axial direction relative to the elongated rod 2.

The lifting module includes at least one lifting base fixed to the expansion member of the expansion module. In the embodiment, there are two lifting bases: a first base plate 51 and a second base plate 52. The first base plate 51 and the second base plate 52 are respectively fixed to the two ends of the hollow rod 4 through flanges. Furthermore, the lifting bases are connected to the mounting plate 6 by a lifting driving member and at least a guiding shaft 9. As a result, the mounting plate 6 is connected to the hollow rod 4 through the guiding shaft 9 and the lifting base.

The lifting driving member can drive the mounting plate 6 to move longitudinally relative to the lifting bases 51, 52 along the direction of the guiding shaft 9. In the embodiment, the lifting driving member includes an adjusting stud 11 fixed to the mounting plate 6 and abutting against the lifting base or the bottom of the external ignition apparatus 22. An adjusting nut 12 is provided at the abutment position of the adjusting stud 11 (the bottom of the adjusting stud 11). Therefore, the mounting place can be moved up and down by screwing the adjusting nut 12, so as to drive the mounting plate 6 to move relative to the lifting bases 51, 52 and adjust the distance between the mounting plate 6 and the lifting bases (the bottom of the external ignition apparatus 22). In another embodiment, the adjusting stud 11 can also be fixed to the lifting bases 51, 52 and abut against the mounting plate 6 or the water cooling device 24, and the adjusting nut 12 is provided at the abutment position. Additionally, in the embodiment, the guiding shaft 9 is fixed to the mounting plate 6 by a mounting screw 16 and a screw hole 91 in the mounting plate 6, therefore the mounting plate 6 can be driven to move up and down along the direction of the guiding shaft 9 by the lifting driving member. In the embodiment, four guiding shaft 9 are provided in parallel to each other. The guiding shafts are fixed to the mounting plate 6, and can penetrate the lifting base 51, 52. Correspondingly, two straight sleeves 8 are arranged on each of the first plate 51 and the second plate 52 for the guiding shafts 9 inserting into or penetrating, so as to improve the guidance, stability and accuracy of the longitudinal movement. Furthermore, the straight sleeves 8 and the guiding shafts 9 can also bear the radial force. In another embodiment, the guiding shafts 9 can also be fixed to the lifting bases 51, 52 and penetrate the mounting plate 6. Wherein two guiding shafts 9 are fixed to the first base plate 51, the other two guiding shafts 9 are fixed to the second base plate 52, and the four straight sleeves are provided at the mounting plate 6 correspondingly for the guiding shafts 9 to insert or penetrate. As a result, the mounting plate 6 can move up and down relative to the lifting bases 51,52 along the guiding shafts 9, so as to drive the external ignition chamber 26 to move up and down.

In the embodiment, the elongated rod 2 is a long rod with a circular cross section and the hollow rod 4 is a hollow rod with a circular cross section. The elongated rod is connected to the spindle member 1 at a connection hole of the spindle member 1. The elongated rod can rotate around its axis in the connection hole and the hollow rod 4 can also rotate around its axis. so that the mounting plate and the external ignition chamber can be driven to rotate correspondingly and the adjustment ways and capabilities for the spatial displacement of the external ignition chamber can be improved. In another embodiment, the elongated rod and the hollow rod can also be in other shapes such as square, which can still adjust the horizontal movement while unable to rotate around itself.

According to the configuration mentioned above, the elongated rod 2 can drive the mounting plate 6 to rotate in the horizontal direction around the spindle member 1; the hollow rod 4 can drive the mounting plate 6 to move laterally along the elongated rod 2; the lifting module can drive the mounting plate 6 to move longitudinal along the direction of the guiding shaft 9; and the mounting plate 6 can drive the water cooling device 24, the heating device 23 and the external ignition chamber 26 to move together, so as to align the flange of the process chamber with the flange of the external ignition chamber.

During the positioning and adjusting process, the position of each module of the adjusting component need to be limited, so as to prevent the elements of the positioning device from falling off and crashing. Accordingly, the lifting module, the expansion module and the rotating module of the present invention each includes a correspondent limit member to adjust the position of the external ignition chamber 26 to a desirable position within a preset range.

Figure 7A:
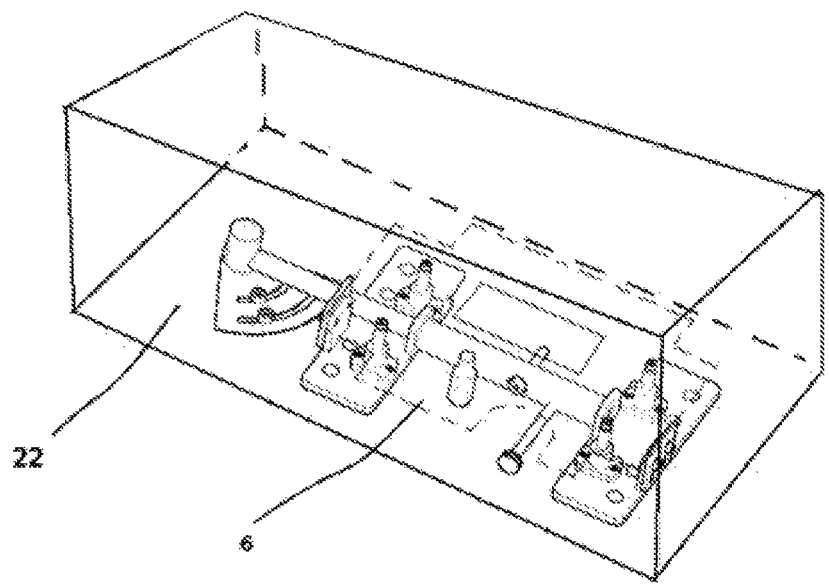
FIGS. 7a and 7b are views showing the swing of the whole mechanism by the positioning device according to the first embodiment of the present invention.
Figure 7B:
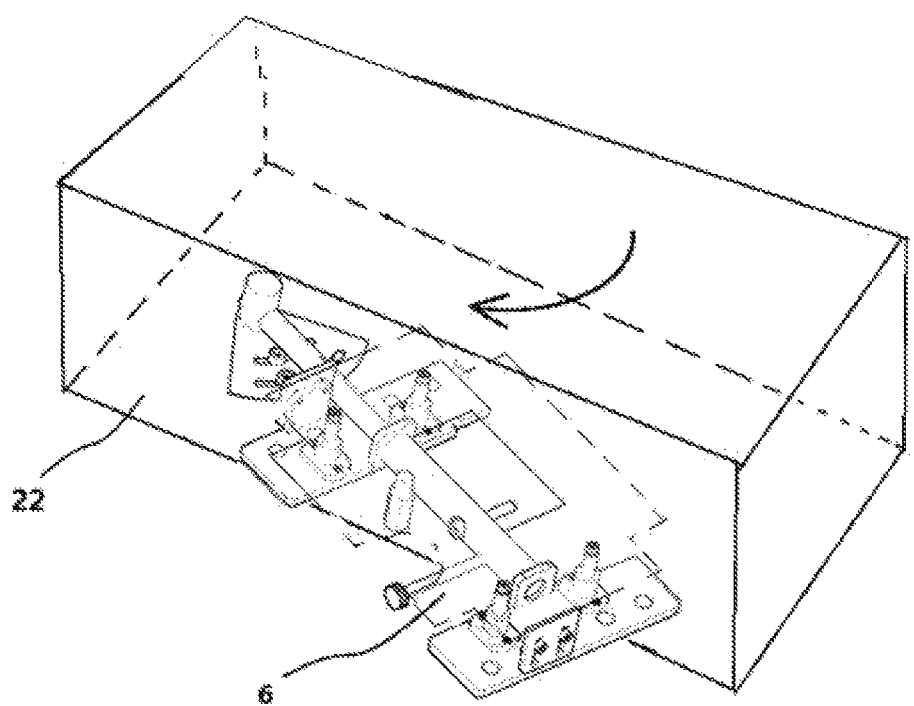

In the embodiment, the rotating module includes a rotating limit member. The rotating limit member includes an angle plate 3 fixed to the spindle member 1. An arc-shaped groove is formed in the angle plate 3. The bottom of the external ignition apparatus 22 is provided with a fixing plate 19. A positioning screw 15 penetrates the arc-shaped groove 31 and is fixed to the fixing plate 19, which limits the range of the horizontal rotation angle of the elongated rod 2 around the spindle member 1 to the radian range of the arc-shaped groove 31, therefore the elongated rod 2 can drive the mounting plate 6 and the external ignition chamber 6 to rotate in and out, as shown in FIG. 7*a* and FIG. 7*b*. In another embodiment, no fixing plate is arranged at the bottom of the external ignition apparatus 22 and the positioning screw 15 can be directly screwed into the bottom of the external ignition apparatus 22. The positioning screw 15 can further play a role of a rotational positioning member to fixe the angle plate 3 to the fixing plate 19 by screwing the positioning screw 15 tightly, so as to prevent the angle plate 3 and the spindle member 1 from rotating. As a result, the angle plate 3 is positioned, and the mounting plate 6, the external ignition chamber 26, the heating device 23 and the water cooling device 24 are positioned at a rotation range within the radian of the arc-shaped groove 31.

In the embodiment, the expansion module further includes an expansion limit member and an expansion positioning member. A lateral long slot 41 is formed in the elongated rod 2 and penetrates the front and back sides of the elongated rod 2, as shown in FIG. 5. A round hole penetrates the front and back sides of the hollow rod 4 and forms a round hole 131 in the front side of the hollow rod 4 and a thread hole (not shown) in the back side. In the embodiment, the expansion limit member is a limit screw 13. The limit screw 13 is inserted into and penetrates the round hole 131 and the lateral long slot in the front and back sides of the elongated rod 2, and then is threaded connected to the back thread hole of the hollow rod 4, so as to limit the lateral movement of the hollow rod 4 relative to the elongated rod 2 to the length of the long slot 41 and plays a role of limiting the lateral movement. After the lateral displacement is adjusted, the expansion positioning member is utilized to perform positioning. In the embodiment, the expansion positioning member is a positioning knob 14, which is inserted into a positioning thread hole (aperture) 141 of the hollow rod 4 and compresses the long rod 2 in the hollow rod 4 after the lateral movement is adjusted by the expansion limit member (limit screw 13), so as to position the hollow rod 4 relative to the elongated rod 2.

In another embodiment, the lateral long slot 41 is only arranged in the front side of the elongated rod 2, and there is no thread hole in the back side of the hollow rod 4. The expansion limit member can still play a role of position limiting, although the stability and the accuracy of the limiting process may be decreased.

Figure 4:
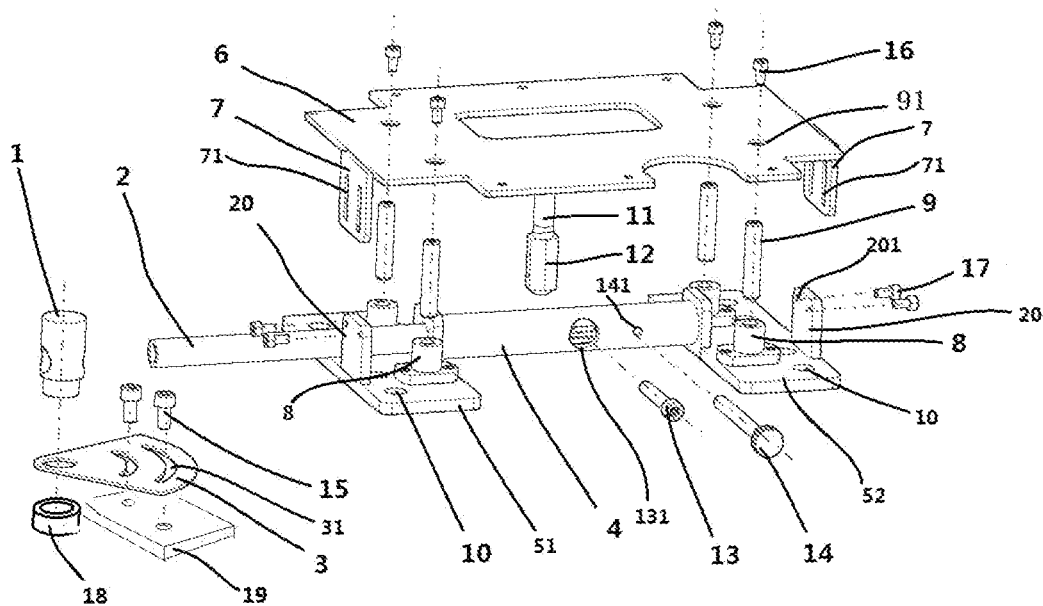
FIG. 4 is a three-dimensional decomposition diagram of the positioning device according to the first embodiment of the present invention.
Figure 6A:
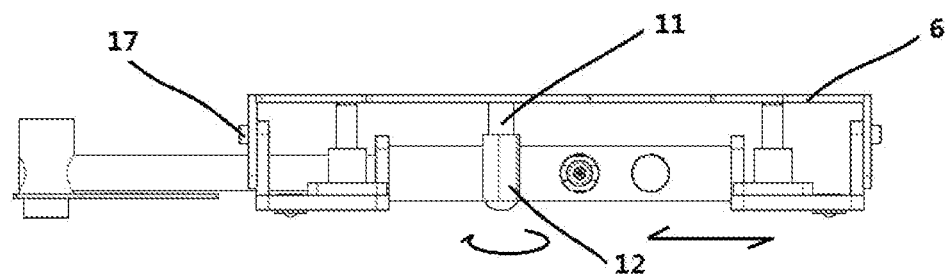
FIGS. 6a and 6b are views showing the height adjustment of the mounting plate by the positioning device according to the first embodiment of the present invention.
Figure 6B:
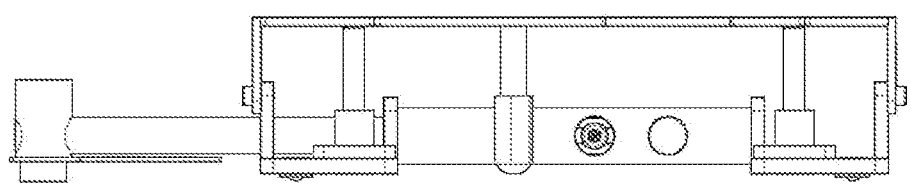

Additionally, the lifting module further includes a height limit member. As shown in FIG. 4, the height limit member includes a long slot block 7 arranged on the mounting plate 6 and a round hole block 20 arranged on the lifting bases 51, 52. In the embodiment, two long slot blocks 7 are arranged at two sides of the mounting plate 61 downwardly, two round hole blocks 20 are arranged respectively on the first base plate 51 and the second base plate 52. Each of the long slot blocks 7 is provided with a longitudinal long slot 71 and each of the round hole block 20 is provided with a height-positioning thread hole 201. In the height adjusting process, a set screw 17 is used as an inserting member to penetrate the longitudinal long slot and insert into the round hole to move up and down in the longitudinal long slot 71. After the height of the mounting plate 6 is adjusted, the set screw 17 is rotated into the height-positioning thread hole 201 and screwed tightly to abut against the long slot block 7 with its end, so as to realize the positioning of the longitudinal displacement, as shown in FIG. 6a and FIG. 6b. In another embodiment, a blocking nut can be arranged at the penetrating position of one or more guiding shafts 9. After the height is adjusted, the blocking nut is screwed to fix the distance between the mounting plate 6 and the lifting bases 51, 52. In another embodiment, after the height of the adjusting stud 11 is adjusted, the longitudinal positioning can also be performed by the self-weight of the external ignition chamber and other parts to prevent the external ignition chamber moving up and down. In this case, the adjusting stud 11 bears the longitudinal force. In addition, the fixing way of the guiding shafts 9 can be adjusted according to the actual requirement. For example, the guiding shaft 9 can be fixed to the lifting bases 51, 52 and the straight sleeve 8 can be arranged on the mounting plate 6, which is opposite to the first embodiment of the present invention. Such configuration can improve the stability of the whole mechanism. Moreover, the positions of the round blocks 20 and the long slot blocks 7 can also be exchanged by providing the lone slot blocks 7 on the two base plate 51, 52 and the round hole blocks at the mounting plate according to the actual requirement.

In the embodiment, a plurality of steel-ball rollers 10 are arranged below the first base plate 51 and the second base plate 52 and abut against the bottom of the external ignition apparatus 22, which makes the whole mechanism move more smoothly and stably at the bottom of the external ignition apparatus 22.

When the external ignition chamber 26 is to be assembled or disassembled, the external ignition chamber 26 should be ensured outside the casing of the external ignition apparatus 22, which means that during the operation, firstly the positioning screw 15 is released and the positioning device is rotated to a designated position outside the casing of the external ignition apparatus 22, then the positioning screw 15 is screwed tightly and the external ignition chamber 26 is assembled or disassembled. After the external ignition chamber is assembled, the positioning screw 15 is released; and then the positioning device is rotated back into the casing, the rotating angle, the radial length, and the height are continuously adjusted until the flange of the external ignition chamber 26 is well aligned with the flange of the main process chamber 21, so as to meet the assembling precision requirement. After that, the positioning screw 15, the positioning knob 14 for radial positioning and the set screw 17 for height fixing are screwed tightly, so as to keep the whole mechanism completely at a positioned state to finish the positioning process.

In the embodiment, the screws and the inserting members mentioned are used for limiting and positioning; in the actual application, inserting member in other forms such as screws, screw bolts, pins can also be used in the present invention.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. A positioning device for a horizontal external ignition apparatus, the external ignition apparatus comprises an external ignition chamber for igniting a process gas to be supplied to a process chamber and a water cooling device fixed outside the external ignition chamber; the positioning device is installed at the bottom of the water cooling device for driving the displacement of the external ignition chamber to make a connecting portion of the external ignition chamber align with a connecting portion of the process chamber; wherein the positioning device comprises a mounting member fixed at the bottom of the water cooling device and an adjusting component connected with the mounting member to move the mounting member; wherein the adjusting component comprises:

a lifting module having at least one lifting base connected to the mounting member through at least one guiding shaft, and a lifting driving member moving the mounting member longitudinally along the direction of the guiding shaft relative to the lifting base;

an expansion module having a stretchable expansion member fixed on the lifting base to move the lifting base and the mounting member laterally along the expansion direction of the expansion member;

a rotating module having a spindle sleeve and a spindle member rotatablely and vertically installed in the spindle sleeve; the spindle member is fixed to the expansion member to drive the expansion member, the lifting base and the mounting member to rotate horizontally around the spindle member.

2. The positioning device according to claim 1, wherein a plurality of the guiding shafts are provided and arranged in parallel to each other, the guiding shafts are fixed to the lifting base and penetrates the mounting member, or fixed to the mounting member and penetrates the lifting base to move the mounting member up and down relative to the lifting base along the direction of the guiding shafts, so as to drive the longitudinal displacement of the external ignition chamber; the lifting driving member of the lifting module has an adjusting stud fixed to the lifting base and abutted against the mounting member or the water cooling device, or fixed to the mounting member and abutted against the lifting base or the bottom of the external ignition apparatus; an adjusting nut is provided at the abutment position of the adjusting nut to adjust the distance between the mounting member and the lifting base by screwing the adjusting nut.

3. The positioning device according to claim 2, wherein the lifting module has two lifting bases fixedly connected to the two ends of the expansion member respectively; each lifting member has two of the guiding shafts; straight sleeves are provided at the lifting bases or the mounting member for the guiding shafts inserting into or penetrating.

4. The positioning device according to claim 2, wherein the lifting module includes a height limit member; the height limit member includes a long slot block having a longitudinal long slot and a round hole block having a round hole provided respectively on the mounting member and the lifting base; an inserting member moves up and down in the longitudinal long slot by penetrating the longitudinal long slot and inserting into the round hole, so as to limit the adjustable range of the distance between the mounting member and the lifting base to the length of the longitudinal long slot.

5. The positioning device according to claim 1, wherein the expansion member includes an elongated rod, and a hollow rod which is sleeved around the elongated rod and is movable along the elongated rod; the elongated rod is fixed to the spindle member, the hollow rod is fixed to the lifting base.

6. The positioning device according to claim 5, wherein each of the elongated rod and the hollow rod has a circular cross section which enables the elongated rod and/or the hollow rod to rotate around the axis thereof and drives the external ignition chamber to rotate around the elongated rod or the hollow rod.

7. The positioning device according to claim 5, wherein the expansion module further includes an expansion positioning member; the hollow rod is provided with an aperture for the expansion positioning member inserting into and compressing the elongated rod in the hollow rod to fix the relative position of the hollow rod and elongated rod.

8. The positioning device according to claim 7, wherein the expansion module also includes an expansion limit member; the elongated rod is provided with a lateral long slot and the hollow rod is provided with a circular hole for the expansion limit member penetrating through to limit the adjustable expansion range of the hollow rod along the elongated rod to the length of the lateral long slot.

9. The positioning device according to claim 8, wherein the lateral long slot penetrates the front and back sides of the elongated rod, the circular hole penetrates the front and back sides of the hollow rod and forms a thread hole at the back side of the hollow rod; the expansion limit member is a limiting screw rod which inserts into the circular hole at the front side of the hollow rod and the lateral long slot at two sides of the elongated rod to be threaded connected to the thread hole.

10. The positioning device according to claim 1, wherein the rotating module further includes a rotating limit member; the rotating limit member includes an angle plate with an arc-shaped groove therein fixed to the spindle member; a positioning screw bolt is positioned in the arc-shaped groove to penetrate the arc-shaped groove of the angle plate and be screwed into the bottom of the external ignition apparatus or a fixing plate at the bottom of the external ignition apparatus, so as to limit the adjustable rotating range of the spindle member to the radian of the arc-shaped groove.

11. The positioning device according to claim 1, wherein the lifting base is provided with a plurality of rollers therebelow which are abutted against the bottom of the external ignition apparatus.

* * * * *